(12) United States Patent
Yamazaki

(10) Patent No.: US 6,389,583 B1
(45) Date of Patent: May 14, 2002

(54) SEMICONDUCTOR DEVICE AND METHOD FOR PATTERN LAYOUT FOR THE SAME USING TOTAL SIZE OF TRANSISTORS

(75) Inventor: Haruji Yamazaki, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/487,940

(22) Filed: Jan. 19, 2000

(30) Foreign Application Priority Data

| Jan. 25, 1999 | (JP) | 11-015951 |
| Jan. 25, 1999 | (JP) | 11-015952 |
| Dec. 9, 1999  | (JP) | 11-349898 |

(51) Int. Cl.[7] .............................................. G06F 17/50
(52) U.S. Cl. ............................................ 716/11; 716/2
(58) Field of Search ............................ 438/22; 257/355, 257/360, 356, 362, 363, 335; 716/2, 3, 9, 10, 19

(56) References Cited

U.S. PATENT DOCUMENTS 6,127,700 A * 10/2000 Bulucea ...................... 257/335

OTHER PUBLICATIONS

Scharf, B.W., May 1998, IEEE, vol. 19 issue5, pp. 160–162.*

* cited by examiner

*Primary Examiner*—Matthew Smith
*Assistant Examiner*—Thuan Do
(74) *Attorney, Agent, or Firm*—Fish & Richardson P.C.

(57) ABSTRACT

A semiconductor device has an N-channel output transistor N1 including a first gate electrode GP11A formed to surround contact holes C11 in a drain region of the output transistor for contacting a first wiring M11. An N-channel protective transistor N2 including a second gate electrode GP12A formed to surround contact holes C12 in a drain region for contacting a second wiring M12. The interval of the contact holes C11 is greater than the interval of contact holes C2 in a source region of each the transistors. By changing the number of the contact holes C11, C12 surrounded by the gate electrodes GP11A and GP12A, the size of each of the N-channel output transistor N1 and N-channel protective transistor N2 is changed.

9 Claims, 8 Drawing Sheets

US 6,389,583 B1

SEMICONDUCTOR DEVICE AND METHOD FOR PATTERN LAYOUT FOR THE SAME USING TOTAL SIZE OF TRANSISTORS

BACKGROUND OF THE INVENTION

1. Field of the Invention

The present invention relates to a semiconductor device, and more particularly to an output circuit capable of adjusting an electrostatic breakdown voltage and a driving current.

2. Description of the Related Art

The circuit configuration of a general output circuit is shown in FIG. 7.

The output circuit 1 as shown in FIG. 7 includes protective transistors for dealing with electrostatic breakdown (a P-channel protective transistor P2 on a VDD side and an N-channel protective transistor N2 on a VSS side) and output transistors (a P-channel output transistor P1 on the VDD side and an N-channel output transistor on the VSS side).

In such a circuit configuration, in order to deal with the electrostatic breakdown, as shown in FIG. 7, there are provided the P-channel protective transistor P2 on the VDD side and the N-channel protective transistor N2 on the VSS side.

Since the electrostatic breakdown strength is correlated with the cell size (or transistor size) of each of the protective transistors P2 and N2, in order to provide a desired electrostatic breakdown strength, the cell size must be changed (Actually, the total size of the protective transistors P2, N2 and output transistors P1, N1 is adjusted).

FIG. 8 is a pattern lay-out diagram of a portion of the output circuit 1 as shown in FIG. 7. For simplicity of illustration, only regions are shown which correspond to the N-channel output transistor N1 and the N-channel protective transistor N2 both of which are located on the VSS side. Incidentally, the pattern layout of the regions corresponding to the P-channel output transistor P1 and the P-channel protective transistor P2 is configured in the same manner (a grounding potential line VSS is substituted for a power potential line VDD.

In FIG. 8, GP1 and GP2 denote gate electrodes made of e.g. a polycrystalline silicon film. The gate electrode GP1 of the N-channel output transistor N1 on the VSS side is connected to an input (IN) terminal, whereas the gate electrode GP2 of the P-channel protective transistor N2 on the VSS side is connected to the grounding potential line VSS.

In FIG. 8, M1 and M2 denote metallic wirings of e.g. aluminum. The metallic wiring M1 connected with an output (OUT) terminal is in contact with the respective drain regions of the above N-channel output transistor N1 and N-channel protective transistor N2 through contact holes C1. The metallic wiring M2 connected to the grounding potential line VSS is in contact with the respective source regions and guard band regions 2 of the above N-channel output transistor N1 and N-channel protective transistor N2 through contact holes C2.

In the microcomputer or logic LSI using such an output circuit 1 developed in recent years, as the case may be, different output currents are required for both the P-channel output transistor P1 and the N-channel output transistor N1 in accordance with a user's request (In this case, for example, the transistor size is increased to increase the output current). Further, the rising or falling speed in an oscillator (OSC) circuit may seriously affect a car audio set or unit so that noise occurs to impair the reliability of the audio set (In this case, the transistor size is reduced to prevent noise from occurring).

Thus, the transistor size of the output transistors P1 and N1 must be adjusted to optimum size. For this purpose, the design of a plurality of mask layers (three sheets of GP, C and M described above) must be changed. Correspondingly, a plurality of photomasks must be created again.

This disadvantageously increases the man-hours of designing the integrated circuit and of making the photomasks.

SUMMARY OF THE INVENTION

An object of the present invention is provide a method of pattern-layout of semiconductor device capable of easily changing the sizes of a protective transistor and output transistor in order to deal with electrostatic breakdown.

Another object of the present invention is to provide a semiconductor device formed by the method of pattern-layout of.

In order to attain the above objects, (for example as shown in FIG. 1,) a semiconductor device according to a first embodiment of the present invention comprises an N-channel output transistor N1 (or P-channel output transistor P1) having a first gate electrode GP11 (A, B) which is formed to surround contact holes C11 formed in its drain region so as to be in contact with a first wiring M11 connected to an output (OUT) terminal, and is connected to an input (IN) terminal; and an N-channel protective transistor N2 (or P-channel output transistor P2) for dealing with electrostatic breakdown having a second gate electrode GP12 (A, B) which is formed to surround contact holes C12 formed in its drain region so as to be in contact with a second wiring M12 connected to a grounding potential line VSS (or power potential line VDD) and is connected to the grounding potential line, and characterized in that an pitch of the contact holes C11 is wider than that of contact holes formed in a source region of each said transistors.

In such a configuration, by changing the number of the contact holes C11, C12 surrounded by the gate electrodes GP11(A, B) and GP12 (A, B), the transistor size of each of the N-channel output transistor N1 and N-channel protective transistor N2 (or P-channel output transistor P1 and P-channel protective transistor P2).

Further, a pattern layout method for such as transistor composed of a protective transistor (P2 or N2) for dealing with electrostatic breakdown and an output transistor (P1 or N1) is characterized in that a transistor size of each of said protective transistor and said output transistor is changed within a total size of both transistors (P1+P2) or (N1+N2).

The patter layout method is characterized in that a design change incident to a change in the transistor size of said transistors is made by only replacing a mask layer for forming the gate electrodes.

A semiconductor device according to the second embodiment of the present invention is characterized in that the pitch of a contact holes C11 is wider than that of the contact holes C2, and in that the transistor size of each of the N-channel output transistor and N-channel protective transistor (or P-channel output transistor and P-channel protective transistor) can be finely adjusted according to a position where an element isolation film F21 (or F31) is formed as shown in FIG. 6.

The pattern layout method for the semiconductor device is characterized in that the transistor size of each of the protective transistor (P2 or N2) for dealing with electrostatic breakdown and output transistor (P1 or N1) is fined adjusted by the position where the element isolation film F21 (or F31) is formed.

The patter layout method is characterized in that a design change incident to a change in the transistor size of said transistors is made by only replacing a mask layer for forming the element isolation film (F).

In accordance with the present invention, the transistor size of each of the protective transistors P2, N2 and output transistors P1, N1 for dealing with the electrostatic breakdown due to the requirement from a user and improvement in the characteristic can be made by only replacing a sheet of the mask layer for forming the gate electrode (GP). This greatly contributes the man-hours of designing an integrated circuit and manufacturing photomasks.

Further, the fine adjustment of the transistor size of each of the protective transistors P2, N2 and output transistors P1, N1 for dealing with the electrostatic breakdown due to the various requirements from users and improvement in the characteristic can be made by only replacing a sheet of the mask layer for forming the element isolation film. This greatly contributes the man-hours of designing an integrated circuit and manufacturing photomasks.

The above and other objects and features of the present invention will be more apparent from the following description taken in conjunction with the accompanying drawings.

DESCRIPTION OF THE PREFERRED EMBODIMENTS

Embodiment 1

Figure 1:
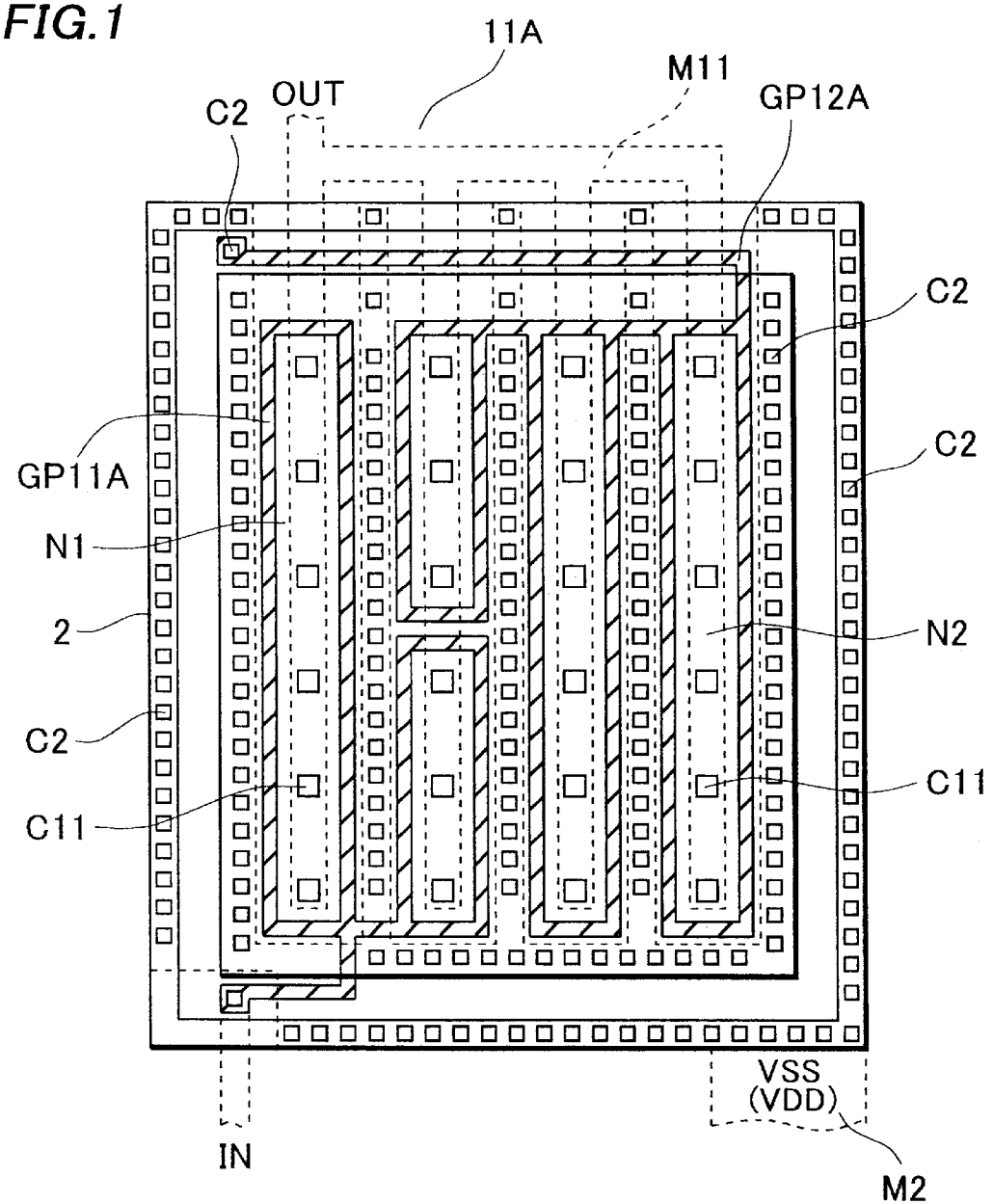
FIGS. 1 and 2 are pattern layout diagrams for explaining a method of changing the transistor size in a semiconductor device according to a first embodiment of the present invention.
Figure 2:
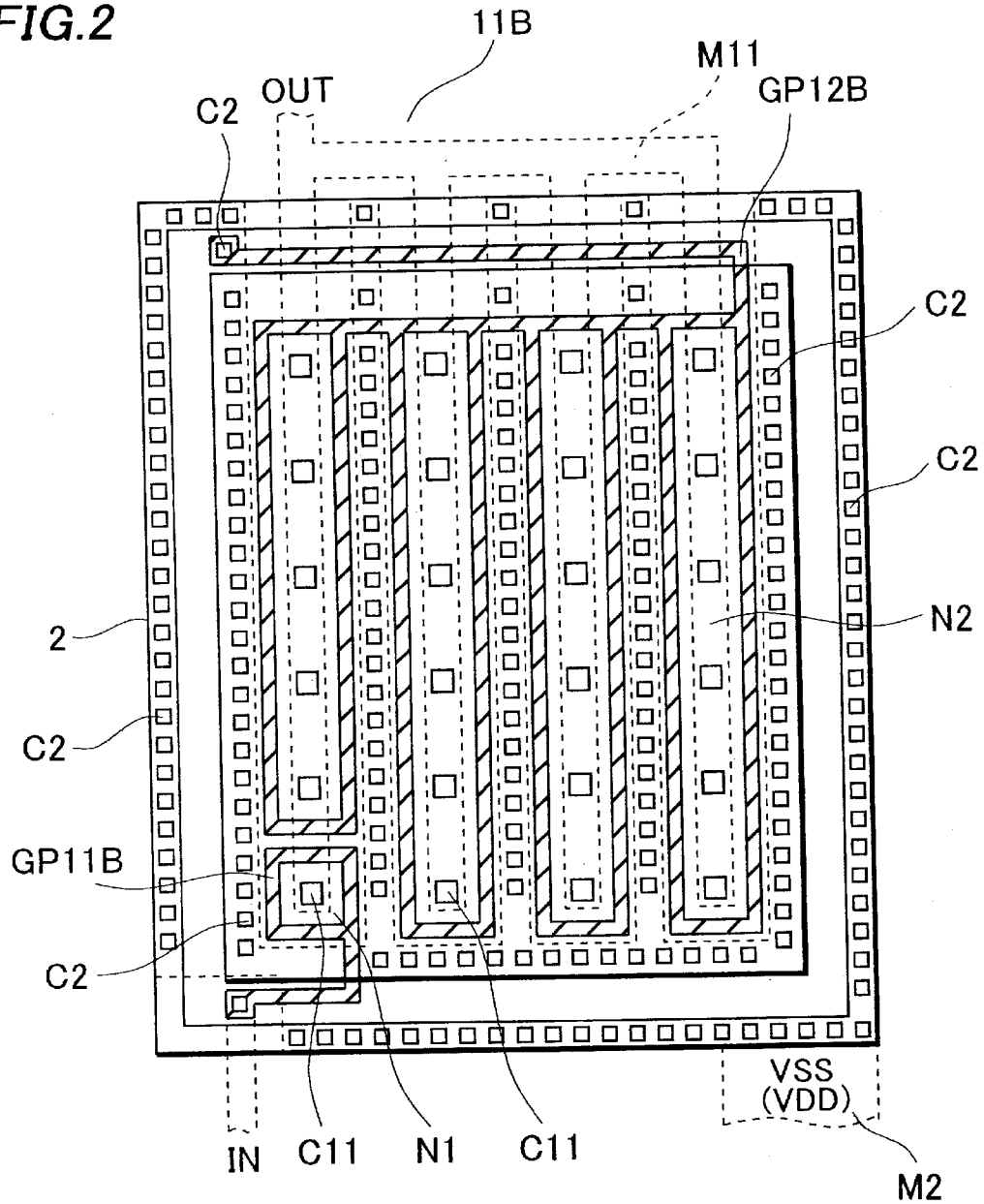
Figure 8:
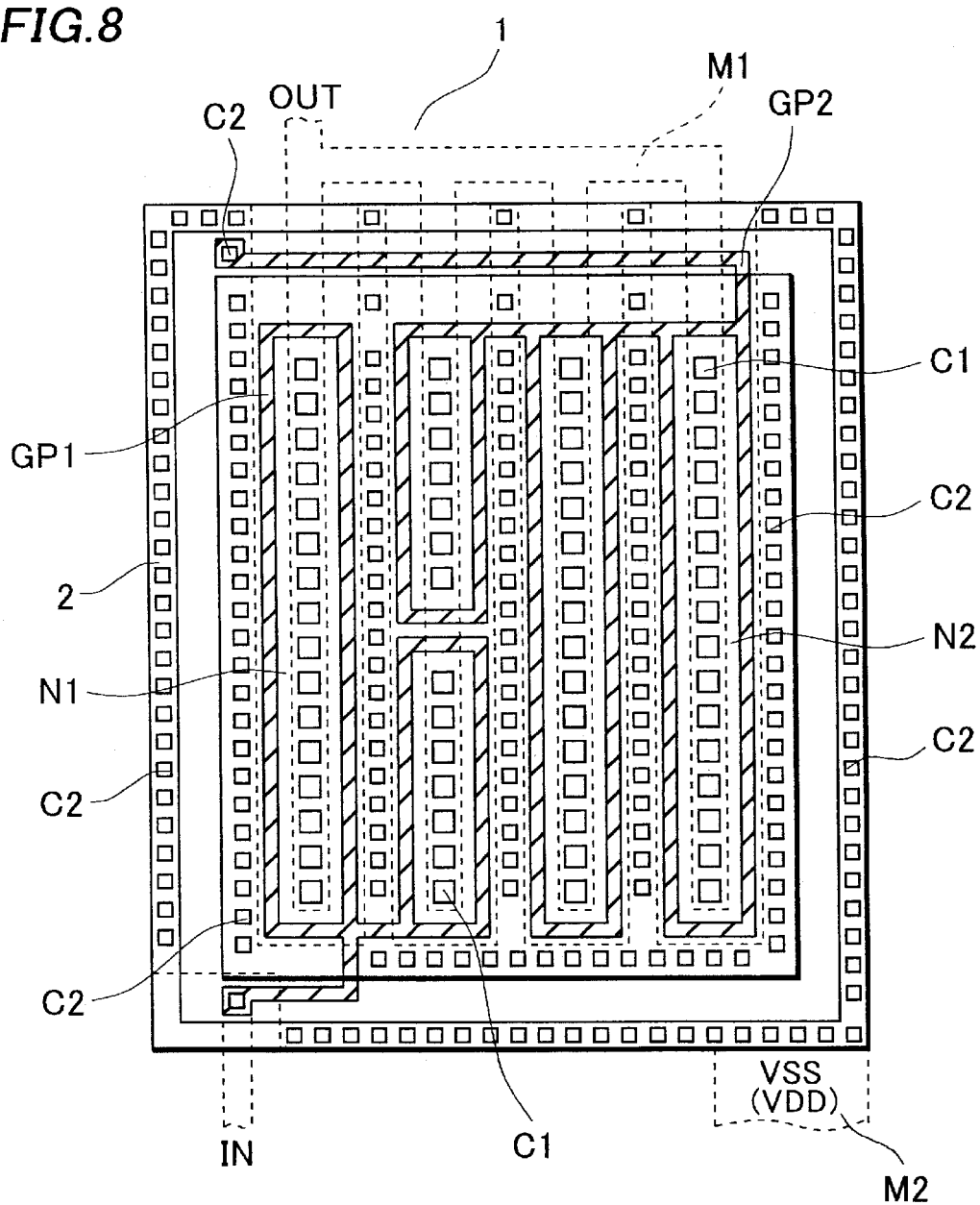
FIG. 8 is a pattern layout diagram showing a part of the output circuit in FIG. 7.

An explanation will be given of a first embodiment of the semiconductor device according to the present invention. The circuit configuration of each of the output circuit 11A and 11B shown in FIGS. 1 and 2, respectively is substantially the same as that of the output circuit as shown in FIG. 8. In FIGS. 1 and 2, like reference numerals refer to like parts in the output circuit as shown in FIG. 8.

The output circuits 11A and 11B according to the present invention are characterized by their pattern layout. Now referring to FIGS. 1 and 2, the pattern layouts will be explained. For convenience of illustration, only the regions are shown which correspond to the N-channel output transistor N1 and N-channel protective transistor N2 on the VSS side. Incidentally, the regions corresponding to the P-channel output transistor P1 and P-channel protective transistor P2 on the VDD side are configured in the same pattern layout (the power potential line VDD is substituted for the grounding potential line VSS).

FIG. 1 represents the output transistor size which corresponds to the conventional N-channel output transistor N1 on the VSS side and the N-channel protective transistor N2 on the VSS side according to the prior art as shown in FIG. 8.

In FIG. 1, symbols GP11A and GP12 denote gate electrodes made of a polycrystalline silicon, or the like. The gate electrode GP11A of the N-channel output transistor N1 on the VSS side is connected to an input (IN) terminal, whereas the gate electrode GP12A of the N-channel protective transistor on the VSS side is connected to the grounding potential line VSS.

Symbols M1 and M2 denote wirings of Al. The wiring M1 connected to an output (OUT) terminal is in contact with each of the drain regions of the N-channel output transistor N1 and N-channel protective transistor N2 through a contact hole C11. The wiring M2 connected to the grounding potential line VSS is in contact with the respective source regions of the N-channel output transistor N1 and N-channel protective transistor N2 and guard band 2 through a contact hole C2.

Incidentally, in this embodiment, the contact holes C2 in contact with the source region and guard band 2 is formed in a minimum design rule (e.g. 0.8 $\mu$m interval) in an application process (e.g. 0.8 $\mu$m process). The pitch of the contact holes C11 in contact with the output (OUT) terminal (drain region) is wider than the pitch of the contact holes C2 (e.g. 10 $\mu$m interval). Further, the size of the contact C2 is 0.8 $\mu$m×0.8 $\mu$m, whereas that of the contact hole C11 is 2 $\mu$m×2 $\mu$m which is larger than the contact C2 in order to deal with electrostatic breakdown.

The pattern layout of the present invention (shown in FIG. 1) is different from the conventional output transistor N1 (shown in FIG. 8) in that the interval (or pitch) of the adjacent contact holes which bring the wiring M11 connected to the output (OUT) terminal into contact with the respective drain regions of the N-channel output transistor N1 and N-channel protective transistor N2 is increased.

In this way, by extending the intervals between the contact holes C11 when the transistor size of each of the output transistors N1, P1 and the protective transistors is changed, the positions where the gate electrodes GP11A and GP12A are formed. Therefore, by changing the positions where the gate electrodes GP11A and GP12A are formed, the transistor size can be easily changed.

In this case, the increase in the resistance due to the fact that the number of the contact holes C11 is decreased as compared with a conventional structure was feared. However, as a result of analysis, it was found that there is a correlation between the interval between the contact holes C11 and the resistance, i.e. that the resistance does not vary greatly in a case of exceeding from a certain border value of the interval, thereby providing a satisfactory characteristic.

Figure 3:
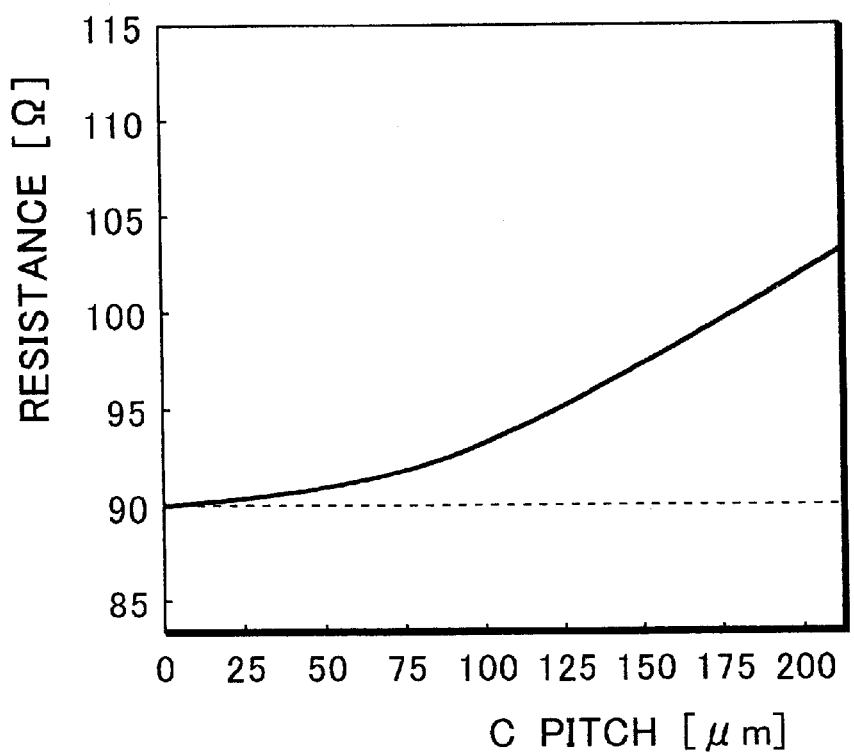
FIG. 3 is a graph showing a relationship between the pitch of a contact hole and resistance.

FIG. 3 is a correlation diagram when the pitch of the contact holes is set at a certain value (indicated in solid line) as compared with the pitch of the conventional contact holes (indicated in dotted line). As seen from this figure, it can be confirmed that the pitch of the contact holes does not almost affect the contact resistance until it reaches 50 μm.

Figure 4:
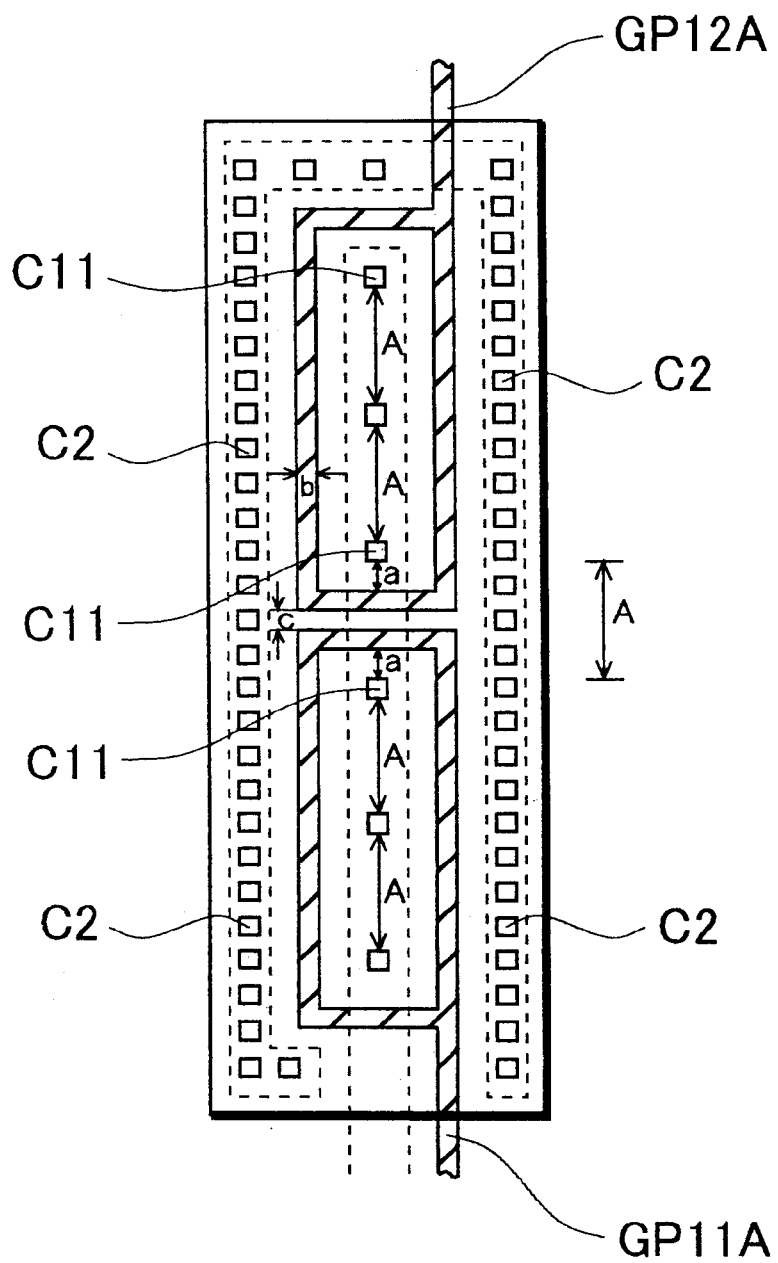
FIG. 4 is another pattern layout diagram for explaining a method of changing the transistor size in a semiconductor device according to the first embodiment of the present invention.

Therefore, in the embodiment according to the present invention as shown in FIG. 4, because the pitch of the contact holes is set at A (e.g. 10 μm), the contact resistance will not increase.

In this embodiment, the pitch of 10μ is adopted which represents the possible range where the adjacent transistors are formed in the pertinent process (0.8 μm design rule). The reason why the pitch of the contact holes is set at 10 μm as shown in FIG. 4 is that the contact holes C11 each having a size of 2 μm require an interval A=a+b+c+b+a. Incidentally, a denotes the distance between the contact hole C11 and gate electrodes GP11A and GP12A; b denotes the width of each of the gate electrodes GP11A and GP12A; and c denotes the distance between the gate electrode GP11A and gate electrode GP12A.

In the present invention, the opening C11 formed in square may be formed in a larger size in a range where it is not an obstacle when the positions where the gate electrodes GP11A and GP12A are formed are changed.

Figure 5:
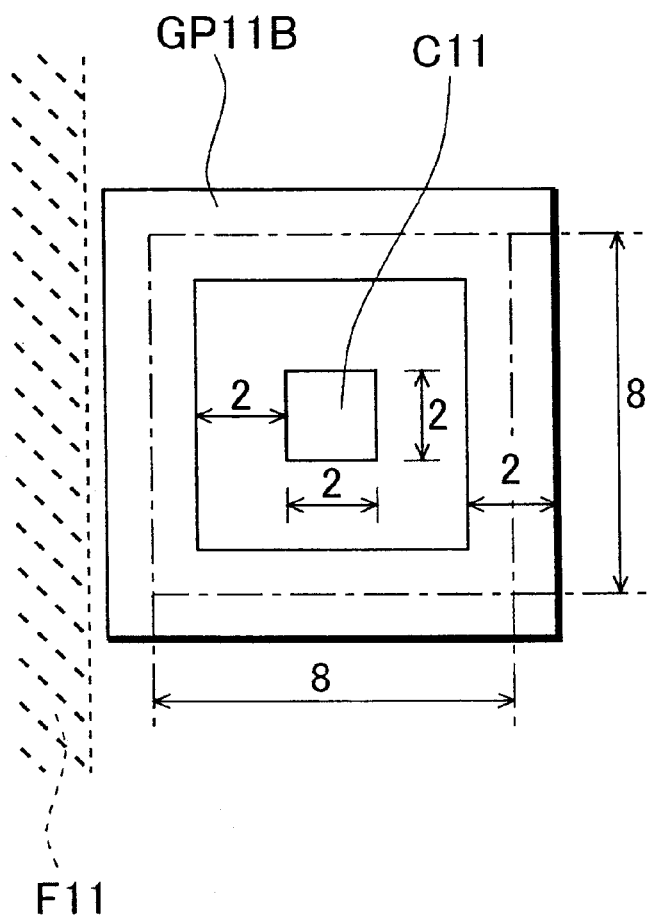
FIG. 5 is still another pattern layout diagram for explaining the minimum unit of the transistor size in a semiconductor device according to the first embodiment of the present invention.

FIG. 5 is a pattern layout diagram of the output transistor N1 (the protective transistor N2 has a larger size) which has a smaller size than that of the output transistor N1 shown in FIG. 1. In this embodiment, the gate electrode GP11B constituting the output transistor N1 is patterned to surround only a single contact hole C11. It is aminimum size of the output transistor N1. Various requirements of changing the size can be satisfied by the number of the contact holes each surrounded by the gate electrode GP11B.

In this way, in order to deal with the electrostatic breakdown, the transistor size of each of the protective transistors P2, N2 and the output transistors P1, N1 can be changed within the total size of the transistors (P1+P2) and (N1+N2).

The design change due to the change in the transistor size of each of the protective transistors P2, N2 and output transistors P1, N1 can be made by only replacing a sheet of the mask layer for forming the gate electrode (GP).

Now referring to the pattern layout diagram of FIG. 5, an explanation will be given of the minimum unit of the transistor size of the semiconductor device (output circuit) according to the present invention. In FIG. 5, the transistor size of the output transistor N1 is exemplified.

The pattern layout diagram shown in FIG. 5 is designed by the process (0.8 μm design rule) as described. A gate electrode GP11B having a width of about 2 μm and being apart by about 2 μm from an adjacent electrode is arranged to surround the contact hole C11 having one side of about 2 μm. A reference symbol F11 denotes an element isolation film.

The current driving capability on the one side is calculated with respect to the size of the central portion of the width of the gate electrode GP 11B. In this case, the current driving capability in the transistor size of the output transistor N1 is about 32 μm (=GW). Similarly, the transistor size (current driving capability) in the minimum unit of the output transistor P1 and protective transistors N2, P2 is also about 32 μm (=GW).

In this way, the current driving capability in the minimum transistor size of the transistor according to this embodiment is about 32 μm (=GW).

Embodiment 2

An explanation will be given of the second embodiment of the present invention.

In comparison to the first embodiment, the feature of the second embodiment resides in that the transistor size (current driving capability) of each of the output transistors N1, P1 and protective transistors N2, P2 is adjusted more finely.

The requirement from a user and improvement of the characteristic, which have been problems to be solved, will be further diversified. In order to deal with such a tendency, fine adjustment must be made. The process rule (0.8 μm rule) described above cannot constitute the minimum transistor having a current driving capability of about 32 μm or less. The process rule must be changed.

In the second embodiment, the position where the element isolation film (F21, F31) is changed so that the fine adjustment of the transistor size (current driving capability) can easily made.

Figure 6A:
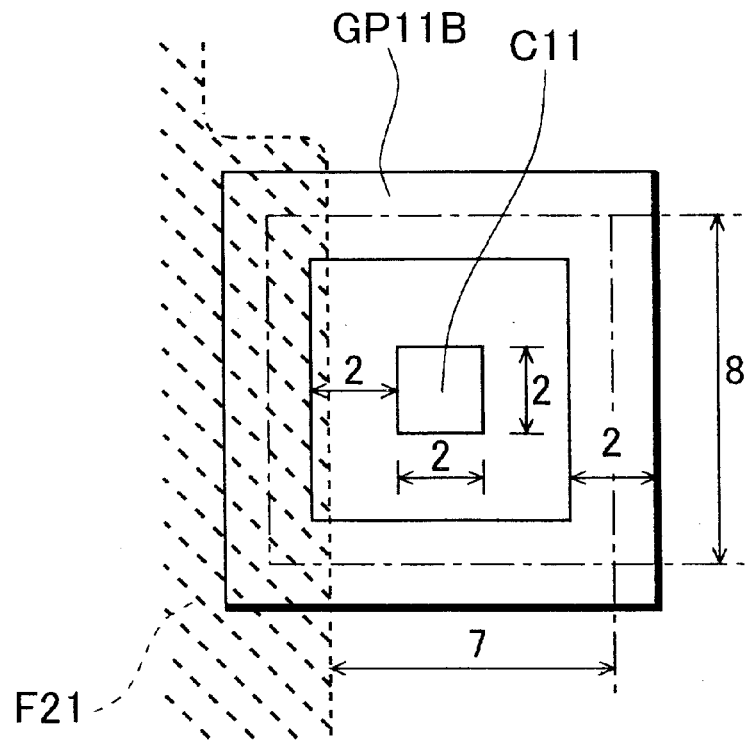
FIG. 6 is a pattern layout diagram for explaining the method of trimming the transistor size in a semiconductor device according to the second embodiment of the present invention.
Figure 6B:
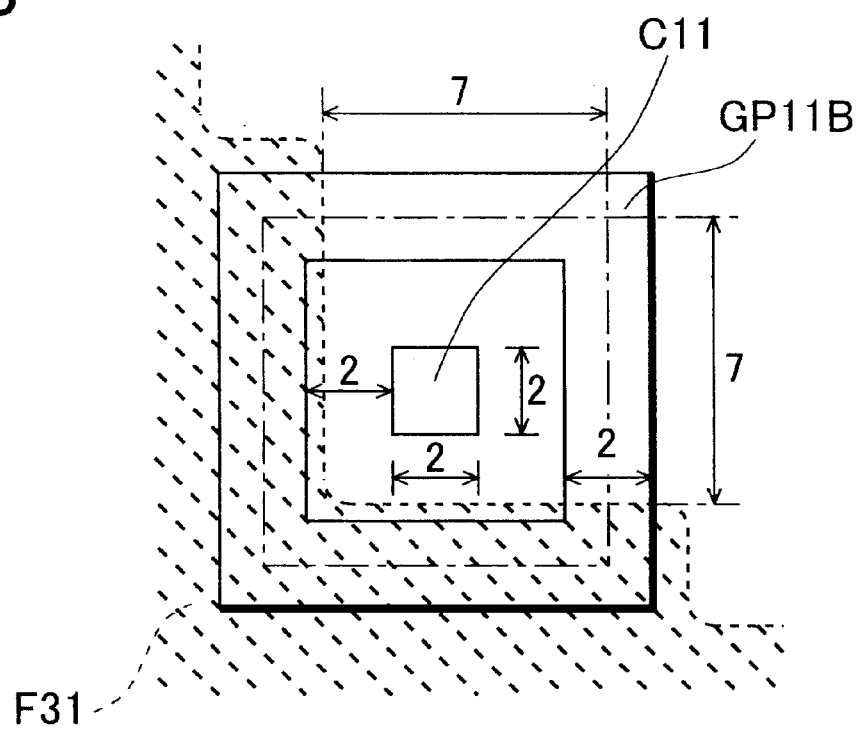
Figure 7:
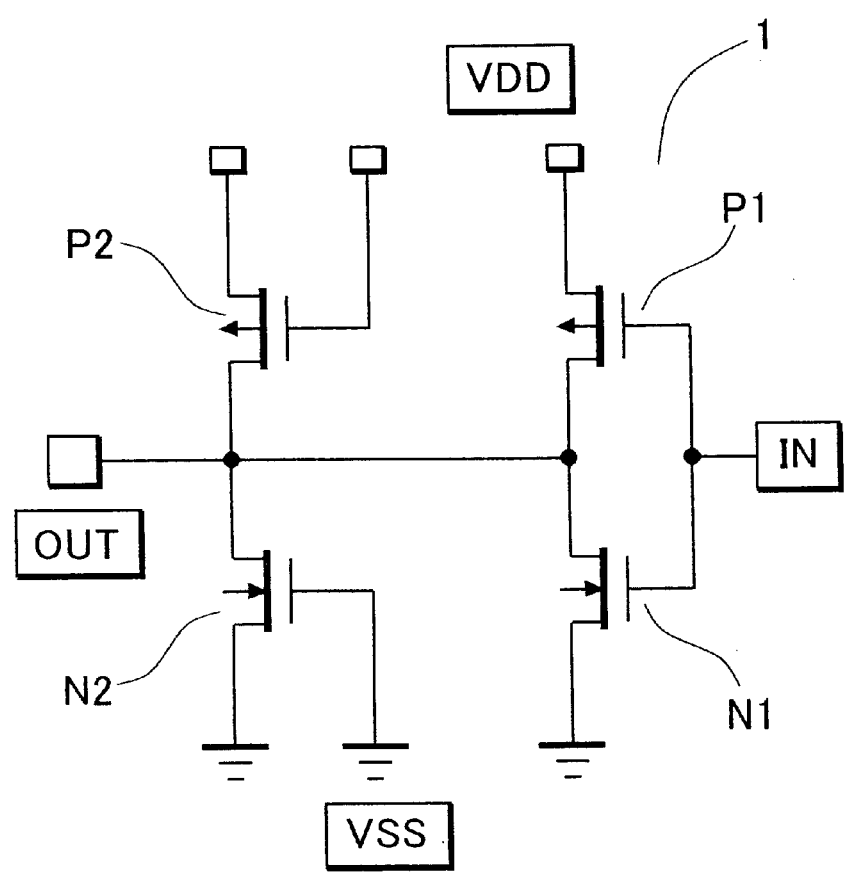
FIG. 7 is a diagram showing a general circuit configuration of an output circuit.

FIGS. 6A and 6B are pattern layout diagrams for explaining a technique of the fine adjustment of the transistor size (current capability).

FIG. 6A shows a pattern layout in which the element isolation film F21 is extended to a region corresponding to the one side of the gate electrode GP11B so that the transistor is not formed in the region.

The current driving capability of the transistor N1 by this pattern layout is about 22 μm (=GW) which is smaller than that of the transistor N1 (about 32 (=GW)) according to the first embodiment (FIG. 5).

FIG. 6B shows a pattern layout in which the element isolation film F31 is extended to a region corresponding to the two sides of the gate electrode GP11B so that the transistor is not formed in the region.

The current driving capability of the transistor N1 by this pattern layout is about 14 μm (=GW) which is further smaller than that of the above transistor N1 (which is about 22 μm) shown in FIG. 6A. Although not shown, by adjusting the position where the element isolation film is to be formed, the transistor size (current driving capability) of the output transistor P1 and protective transistors N2, P2 can be finely adjusted.

As described above, in accordance with this embodiment, as in the first embodiment, the pitch of the contact hole C11 formed in the drain region is made larger than that of the contact hole C2 formed in the source region and others, and because of the presence of the element isolation film (F21, F31), the transistor is not formed in at least a portion of the region where the output transistors N1, P1 and protective transistors N2, P2 are to be formed. In this way, the further fine adjustment of the transistor size (current driving capability) can be made easily. Accordingly, without changing the transistor size, it is possible to deal with the various requirements from users and improvement in the characteristic.

The design change due to the fine adjustment in the transistor size of each of the protective transistors P2, N2 and output transistors P1, N1 can be made by only replacing a sheet of the mask layer for forming the gate electrode (GP).

What is claimed is:

1. A pattern layout method for a semiconductor device comprising:
    changing a size of a protective transistor and of an output transistor within a fixed total size of both transistors; wherein said protective transistor protects the semiconductor device from electrostatic breakdown.

2. A pattern layout method for a semiconductor according to claim 1, further comprising:

replacing a mask layer for forming gate electrodes to change the size of the protective transistor and of the output transistor.

3. A pattern layout method for semiconductor according to claim 1, further comprising:

providing in each transistor first contact holes formed in a drain region and second contact holes formed in a source region, an interval between adjacent first contact holes being greater than an interval between adjacent second contact holes; and replacing a mask layer for forming gate electrodes to change the size of said transistors.

4. A pattern layout method for a semiconductor according to claim 1, replacing a mask layer for gate electrodes and a mask layer for element isolation film to change the size of said transistors.

5. A pattern layout method for a semiconductor according to claim 1, replacing a mask layer for forming an element isolation film to change the transistor size of said transistors.

6. A pattern layout method for a semiconductor device according to claim 1, further comprising:

providing an N-channel output transistor including a first gate electrode configured to surround first contact holes formed in a drain region of the output transistor;

providing an N-channel protective transistor including a second gate electrode configured to surround first contact holes formed in a drain region of the protective transistor;

wherein an interval of said adjacent first contact holes is made greater than that of adjacent second contact holes formed in a source region of each of said transistors; and changing the size of said transistors by replacing a mask layer for forming gate electrodes to change the number of the first contact holes surrounded by each gate electrode.

7. A pattern layout method for a semiconductor device according to claim 1, comprising:

providing a P-channel output transistor including a first gate electrode configured to surround first contact holes formed in a drain region of the output transistor;

providing a P-channel protective transistor including a second gate electrode configured to surround first contact holes formed in a drain region of the protective transistor;

wherein an interval of said adjacent first contact holes is made greater than that of adjacent second contact holes formed in a source region of each of said transistors; and changing the size of said transistors by providing a mask layer for forming gate electrodes to change the number of the first contact holes surrounded by each gate electrode.

8. A pattern layout method for a semiconductor device according to claim 1, comprising:

providing an N-channel output transistor including a first gate electrode configured to surround first contact holes formed in a drain region of the output transistor;

providing an N-channel protective transistor including a second gate electrode configured to surround first contact holes formed in a drain region of the protective transistor;

wherein an interval of said adjacent first contact holes is made greater than that of adjacent second contact holes formed in a source region of each of said transistors; and changing the transistor size of said transistors by providing a mask layer for forming gate electrodes to change the number of the first contact holes surrounded by each gate electrode and providing a mask layer for element isolation film.

9. A pattern layout method for a semiconductor device according to claim 1, comprising:

providing a P-channel output transistor including a first gate electrode configured to surround first contact holes formed in a drain region of the output transistor;

providing a P-channel protective transistor including a second gate electrode configured to surround the first contact holes formed in a drain region of the protective transistor;

wherein an interval of said adjacent first contact holes is made greater than that of adjacent second contact holes formed in a source region of each of said transistors; and changing the transistor size of said transistors by providing a mask layer for forming gate electrodes to change the number of the first contact holes surrounded by each gate electrode and providing a mask layer for element isolation film.

* * * * *